United States Patent
Ka et al.

(10) Patent No.: US 12,238,994 B2
(45) Date of Patent: Feb. 25, 2025

(54) ORGANIC LIGHT-EMITTING DISPLAY DEVICE

(71) Applicant: SAMSUNG DISPLAY CO., LTD., Yongin-si (KR)

(72) Inventors: Ji Hyun Ka, Anyang-si (KR); Seung Ji Cha, Seoul (KR); Tae Hoon Kwon, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 59 days.

(21) Appl. No.: 18/181,893

(22) Filed: Mar. 10, 2023

(65) Prior Publication Data

US 2023/0217756 A1 Jul. 6, 2023

Related U.S. Application Data

(63) Continuation of application No. 16/895,300, filed on Jun. 8, 2020, now Pat. No. 11,616,111, which is a (Continued)

(30) Foreign Application Priority Data

Sep. 7, 2017 (KR) .................. 10-2017-0114511

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *H10K 59/12* (2023.02); *H10K 59/1216* (2023.02); *H10K 59/1315* (2023.02)

(58) Field of Classification Search
CPC ............ H10K 59/131; H10K 59/1216; H10K 59/1315; H10K 59/12; H10K 27/124; H10K 27/1244; G09G 3/3233
See application file for complete search history.

(56) References Cited

U.S. PATENT DOCUMENTS 7,821,040 B2 10/2010 Seong et al.
8,004,016 B2 8/2011 Seong et al.
(Continued)

FOREIGN PATENT DOCUMENTS

KR 10-2008-0050795 6/2008
KR 10-2008-0074367 A 8/2008
(Continued)

OTHER PUBLICATIONS

KIPO Notice of Allowance issued on Nov. 19, 2022 in corresponding KR Application No. 10-2022-0016867, 2 pages.

*Primary Examiner* — Jesse Y Miyoshi
*Assistant Examiner* — Andrew Chung
(74) *Attorney, Agent, or Firm* — Lewis Roca Rothgerber Christie LLP

(57) ABSTRACT

An organic light-emitting display device includes: a substrate on which a display area and a non-display area surrounding the display area are defined, the display area includes a main area and at least one protruding area, and a plurality of pixels is in the display area; a first signal line on the substrate in the main area to provide signals to the plurality of pixels; a second signal line on the substrate in the protruding area to provide signals to the plurality of pixels; a compensation line on the substrate in the non-display area and electrically connected to the second signal line; and a bridge pattern over the second signal line and the compensation line in the non-display area and electrically connect- (Continued)

ing the second signal line with the compensation line, the bridge pattern including a double-bridge structure.

17 Claims, 10 Drawing Sheets

Related U.S. Application Data continuation of application No. 16/103,854, filed on Aug. 14, 2018, now Pat. No. 10,680,054.

(51) Int. Cl.
*H10K 59/12* (2023.01)
*H10K 59/121* (2023.01)

(56) References Cited

U.S. PATENT DOCUMENTS

| | | |
|---|---|---|
| 10,062,317 B2 | 8/2018 | Kim et al. |
| 2007/0080433 A1 | 4/2007 | Lai |
| 2008/0157364 A1 | 7/2008 | Yang et al. |
| 2016/0111040 A1 | 4/2016 | Kim et al. |
| 2017/0193914 A1 | 7/2017 | Heo et al. |
| 2019/0051718 A1 | 2/2019 | Zhang et al. |
| 2019/0096914 A1 | 3/2019 | Hosokawa et al. |
| 2019/0181213 A1 | 6/2019 | Lim |

FOREIGN PATENT DOCUMENTS

| | | |
|---|---|---|
| KR | 10-1101070 B1 | 4/2011 |
| KR | 10-2017-0046841 A | 5/2017 |

ORGANIC LIGHT-EMITTING DISPLAY DEVICE

CROSS-REFERENCE TO RELATED APPLICATIONS

This application is a continuation of U.S. patent application Ser. No. 16/895,300, filed on Jun. 8, 2020, which is a continuation of U.S. patent application Ser. No. 16/103,854, filed on Aug. 14, 2018, which claims priority to and the benefit of Korean Patent Application No. 10-2017-0114511, filed on Sep. 7, 2017 in the Korean Intellectual Property office, the entire disclosures of all of which are incorporated herein by reference.

BACKGROUND

1. Field

Aspects of embodiments of the present disclosure relate to an organic light-emitting display device.

2. Description of the Related Art

Display devices become more and more important as multimedia technology evolves. Accordingly, a variety of types of display devices, such as liquid-crystal display (LCD) devices and organic light-emitting display (OLED) devices are currently used.

Among them, an organic light-emitting display device displays images by using an organic light-emitting device that emits light as electrons and holes recombine. Such an organic light-emitting display device has advantages in that it has fast response speed, high luminance and large viewing angle, and low power consumption.

In addition, since organic light-emitting display devices are self-luminous in which each pixel can generate light on its own, there is the advantage over other types of display devices in that it allows for a variety of shapes of the display area where images are displayed.

An organic light-emitting display device typically includes a plurality of pixels each displaying one of three colors of red, green, and blue. Each of the pixels can be driven individually by drivers in which a plurality of thin-film transistors and a variety of metal lines are disposed.

During a process of fabricating an organic light-emitting display device, a plurality of insulating layers and a plurality of metal layers are stacked on one another. In doing so, undesirable high-voltage static electricity may be generated in a process of stacking insulating layers. If such static electricity is introduced into a driver of the organic light-emitting display device, the characteristics of the pixels may become different from one another, such that the display quality may be deteriorated.

SUMMARY

According to an aspect of embodiments of the present disclosure, an organic light-emitting display device that can prevent or substantially prevent display quality from being deteriorated due to static electricity is provided.

These and other aspects, embodiments, and advantages of the present disclosure will become apparent to those of ordinary skill in the art upon review of the description and claims to follow.

According to exemplary embodiments of the present disclosure, an organic light-emitting display device can prevent or substantially prevent the display quality from being deteriorated due to static electricity.

It should be noted that effects of the present disclosure are not limited to those described above, and other effects of the present disclosure will be apparent to those skilled in the art from the following description.

BRIEF DESCRIPTION OF THE DRAWINGS

The above and other aspects and features of the present disclosure will become more apparent by describing in further detail some exemplary embodiments thereof with reference to the attached drawings, in which.

DETAILED DESCRIPTION

The present invention will now be described more fully herein with reference to the accompanying drawings, in which some exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Same reference numbers indicate the same components throughout the specification. In the attached figures, the thickness of layers and regions may be exaggerated for clarity.

It is to be understood that, although the terms "first," "second," "third," etc. may be used herein to describe various elements, these elements should not be limited by these terms. These terms are used to distinguish one element from another element. Thus, a first element discussed below could be termed a "second" element without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It is to be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented above the other elements or features. Thus, the exemplary term "below" can encompass both an orientation of above and below. The device may be otherwise oriented (rotated 90 degrees or at other orientations) and the spatially relative descriptors used herein interpreted accordingly.

Herein, some exemplary embodiments of the present disclosure will be described in further detail with reference to the accompanying drawings.

Figure 1:
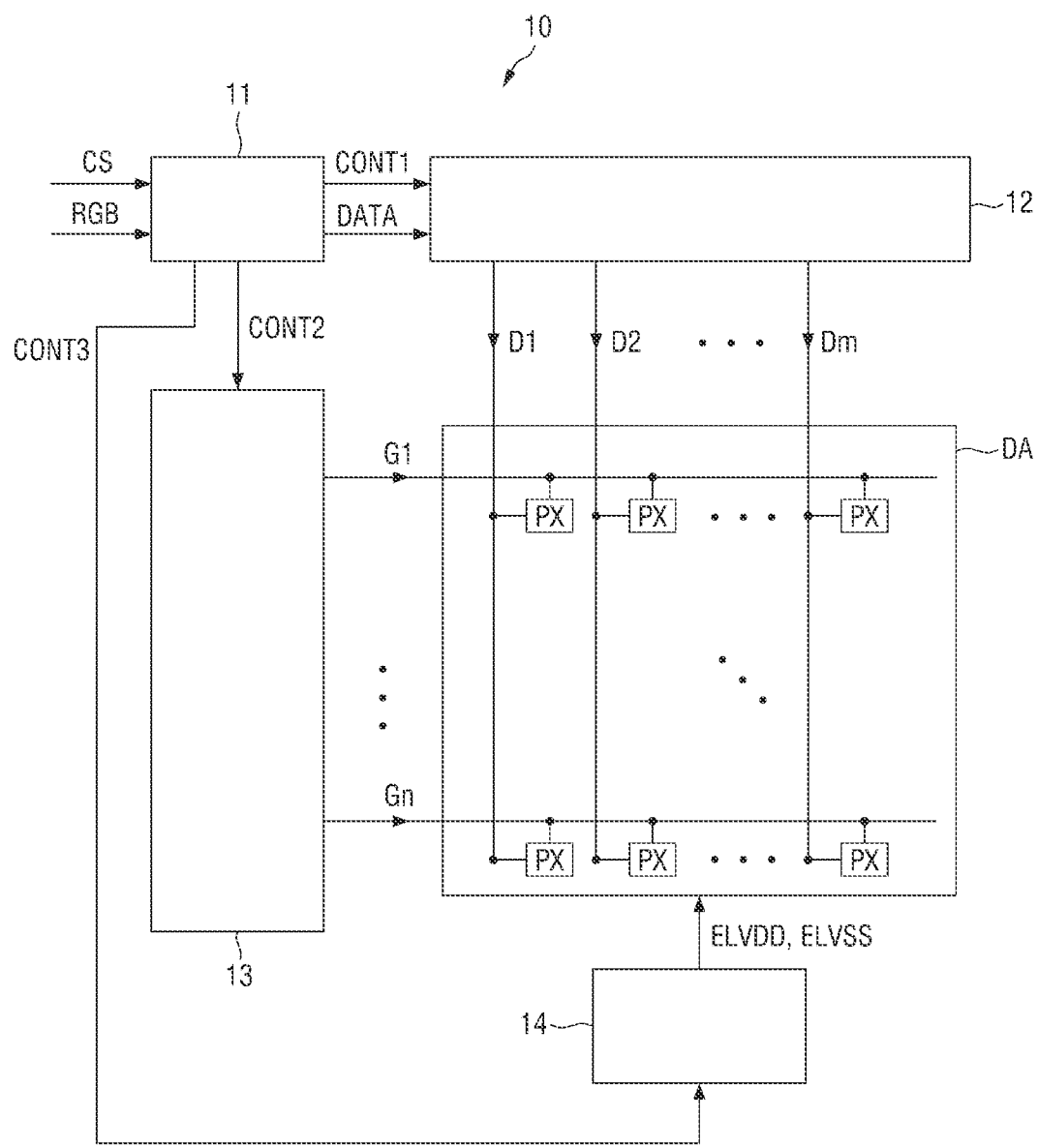
FIG. 1 is a block diagram of an organic light-emitting display device according to an exemplary embodiment of the present disclosure.

FIG. 1 is a block diagram of an organic light-emitting display device according to an exemplary embodiment of the present disclosure.

Referring to FIG. 1, an organic light-emitting display device 10 includes a display area DA, a signal controller 11, a data driver 12, a scan driver 13, a gate driver (not shown), and a power supply 14.

The display area DA may be an area where images are displayed. The display area DA according to an exemplary embodiment of the present disclosure is shown in FIG. 1 as having a rectangular shape for illustrating a circuit connection. However, an actual shape of the display area will be described in further detail later. The display area DA may include a plurality of gate lines, a plurality of data lines intersecting with the plurality of gate lines, and a plurality of pixels PX each connected to the respective gate lines and data lines. The plurality of data lines may be extended in a row direction (e.g., a direction in which the number of rows increments). The plurality of gate lines may be extended in a column direction (e.g., a direction in which the number of columns increments). A plurality of power supply lines may be further disposed in the display area DA. Each of the plurality of power supply lines may be connected to the respective pixels PX.

The signal controller 11 may receive a control signal CS and image signals R, G, and B from an external device. The image signals R, G, and B contain luminance information of the plurality of pixels PX. In an embodiment, the control signal CS may include a vertical synchronization signal (Vsync), a horizontal synchronization signal (Hsync), a data enable signal (DE), and a clock signal (CLK). The signal controller 11 may generate first to third driving control signals CONT1 to CONT3 and image data DATA according to the image signals R, G, and B and the control signal CS.

The gate driver may be connected to the plurality of gate lines in the display area DA and may generate a plurality of gate signals G1 to Gn according to the second driving control signal CONT2. The gate driver 140 may sequentially apply the plurality of gate signals G1 to Gn at a gate-on voltage level to the plurality of gate lines.

The data driver 12 may be connected to the plurality of data lines in the display area DA, and may sample and hold the image data DATA input in response to the first driving control signal CONT1 to convert it into an analog voltage, thereby generating a plurality of data signals D1 to Dm. The data driver 12 may transmit the plurality of data signals D1 to Dm to the respective data lines. The pixels PX in the display area DA may be turned on individually upon receiving the gate signals G1 to Gn at the gate-on voltage level and may receive the data signals D1 to Dm.

The scan driver 13 may be connected to the plurality of gate lines in the display area DA and may generate the plurality of scan signals G1 to Gn in response to the second driving control signal CONT2, to provide them to the gate lines.

The power supply 14 may supply a first supply voltage ELVDD and a second supply voltage ELVSS to a plurality of power supply lines connected to the plurality of pixels PX. The first supply voltage ELVDD and the second supply voltage ELVSS may generate a driving current for each of the pixels PX.

Although not shown in the drawings, the gate signals G1 to Gn, the data signals D1 to Dm, the first supply voltage ELVDD, the second supply voltage ELVSS and other signals may be provided to each of the pixels via additional lines. In an embodiment, these signals may be used for initializing certain nodes, compensating threshold voltages, and detecting and compensating degradation, in order to improve the display quality the organic light-emitting display device 10.

Figure 2:
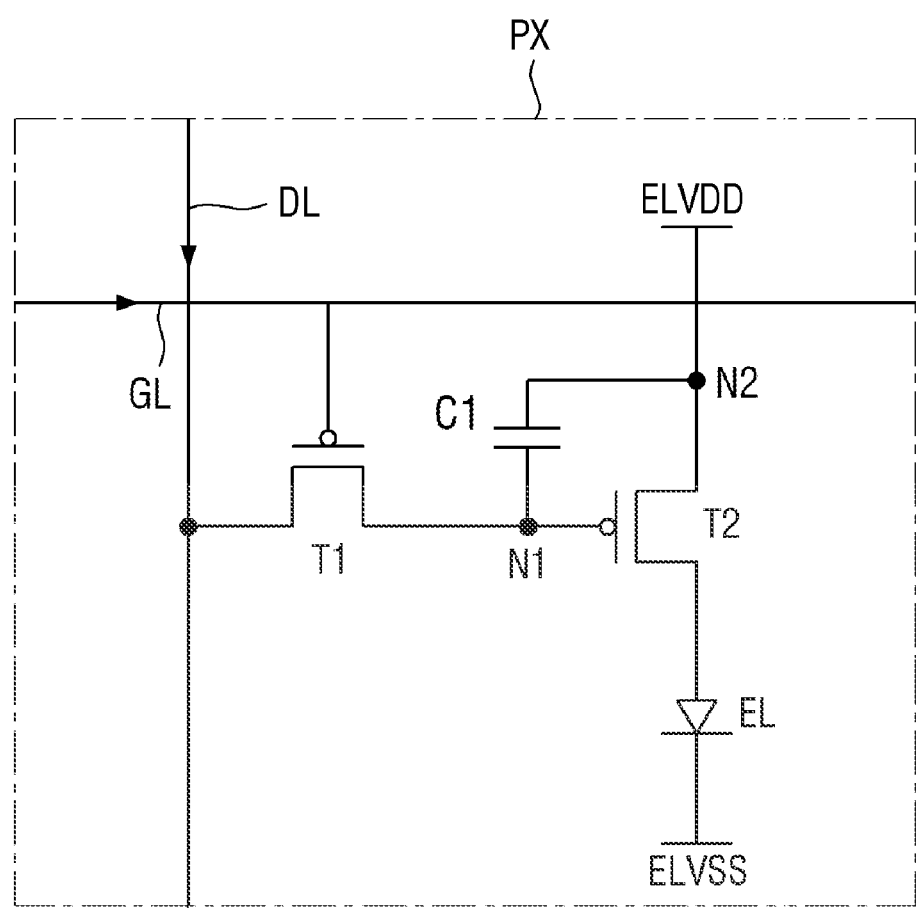
FIG. 2 is a circuit diagram of a pixel according to an exemplary embodiment of the present disclosure.

FIG. 2 is a circuit diagram of a pixel according to an exemplary embodiment of the present disclosure.

Referring to FIG. 2, a pixel PX includes a first transistor T1, a second transistor T2, a first capacitor C1, and an organic light-emitting element EL.

The first transistor T1 may include a control electrode connected to a gate line GL, an input electrode connected to a data line DL, and an output electrode connected to a first node N1. The first transistor T1 may be turned on upon receiving a gate signal having the voltage level of the on-level applied to the gate line GL, and may transmit a data signal to the first node N1.

The second transistor T2 may include a control electrode connected to the first node N1, an input electrode connected to a second node N2, and an output electrode connected to an anode electrode of the organic light-emitting element EL. The second node N2 may receive the first supply voltage ELVDD.

The first capacitor C1 may be disposed between the first node N1 and the second node N2. The data signal provided from the first transistor T1 may charge the first capacitor C1 with the corresponding voltage. The first capacitor C1 may hold the voltage at the control electrode of the second transistor T2 to a predetermined level. The second transistor T2 may control the driving current supplied from the first supply voltage ELVDD to the organic light-emitting element EL based on the voltage held at the first node N1.

The organic light-emitting element EL may include an anode electrode connected to a third node (not shown), a cathode electrode connected to the second supply voltage ELVSS, and an organic emission layer (not shown). The organic emission layer may emit light of one of primary colors. In an embodiment, the primary colors may be the three colors of red, green, and blue. A desired color may be displayed by combining these three primary colors in the same space or at the same time. The organic emission layer (not shown) may include a small-molecule organic material or a polymer organic material corresponding to each color. Depending on the amount of current flowing through the organic emission layer (not shown), the organic material corresponding to each color can emit light.

Figure 3:
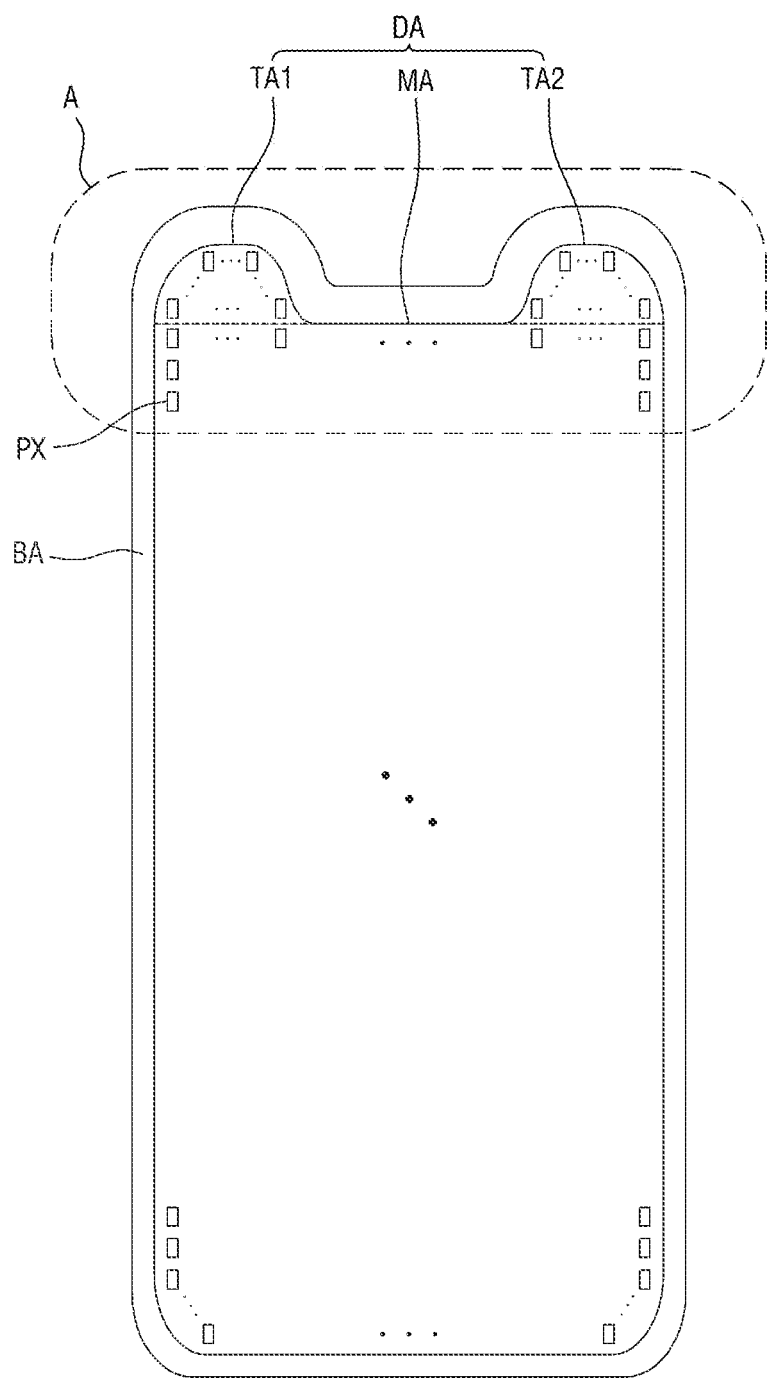
FIG. 3 is a layout diagram of an organic light-emitting display device according to an exemplary embodiment of the present disclosure.

FIG. 3 is a layout diagram of an organic light-emitting display device according to an exemplary embodiment of the present disclosure.

Referring to FIG. 3, an organic light-emitting display device according to an exemplary embodiment of the present disclosure includes a display area DA in which the plurality of pixels PX is disposed to display images, and a non-display area BA other than the display area DA.

The display area DA displays images as described above, and includes the plurality of pixels PX.

According to an exemplary embodiment of the present disclosure, the display area DA may include a main area MA, a first protruding area TA1, and a second protruding area TA2. The main area MA occupies most of the display area DA and may have a substantially rectangular shape. The first protruding area TA1 and the second protruding area TA2 may be formed to be in contact with the main area MA and may be areas for displaying images that have a shape protruding from the main area MA in a specific direction. According to an exemplary embodiment, as depicted in FIG. 3, the first protruding area TA1 may be disposed at a left upper end of the main area MA, and the second protruding area TA2 may be disposed at a right upper end of the main area MA.

When the display area DA has such a shape, the length of the gate lines GL, the length of the data lines DL, and the length of the power supply lines may be different in the main area MA, in the first protruding area TA1, and in the second protruding area TA2 depending on the directions in which they are extended. Particularly, at the boundary between the main area MA and the first protruding area TA1 and at the boundary between the main area MA and the second protruding area TA2, differences in the lengths between the lines may be sharp.

In this case, the resistance of each of the lines and the capacitance to the other lines may also change sharply, such that mura may be seen at the boundary between the main area MA and the first protruding area TA1 and the boundary between the main area MA and the second protruding area TA2, thereby deteriorating the display quality.

Therefore, an additional compensating wiring structure is used to prevent or substantially prevent this, which will be described in further detail later.

The non-display area BA does not display images, but includes elements for displaying images on the display area DA. In an embodiment, the non-display area BA may be disposed such that it surrounds the display area DA.

In the non-display area BA, circuit elements, driving chips, and electronic components for performing the functions of the signal controller 11, the data driver 12, the gate driver, and the power supply 14 may be disposed. Furthermore, a compensation wiring structure may be disposed in order to prevent or substantially prevent mura at the boundary between the main area MA and the first protruding area TA1 and at the boundary between the main area MA and the second protruding area TA2.

Figure 4:
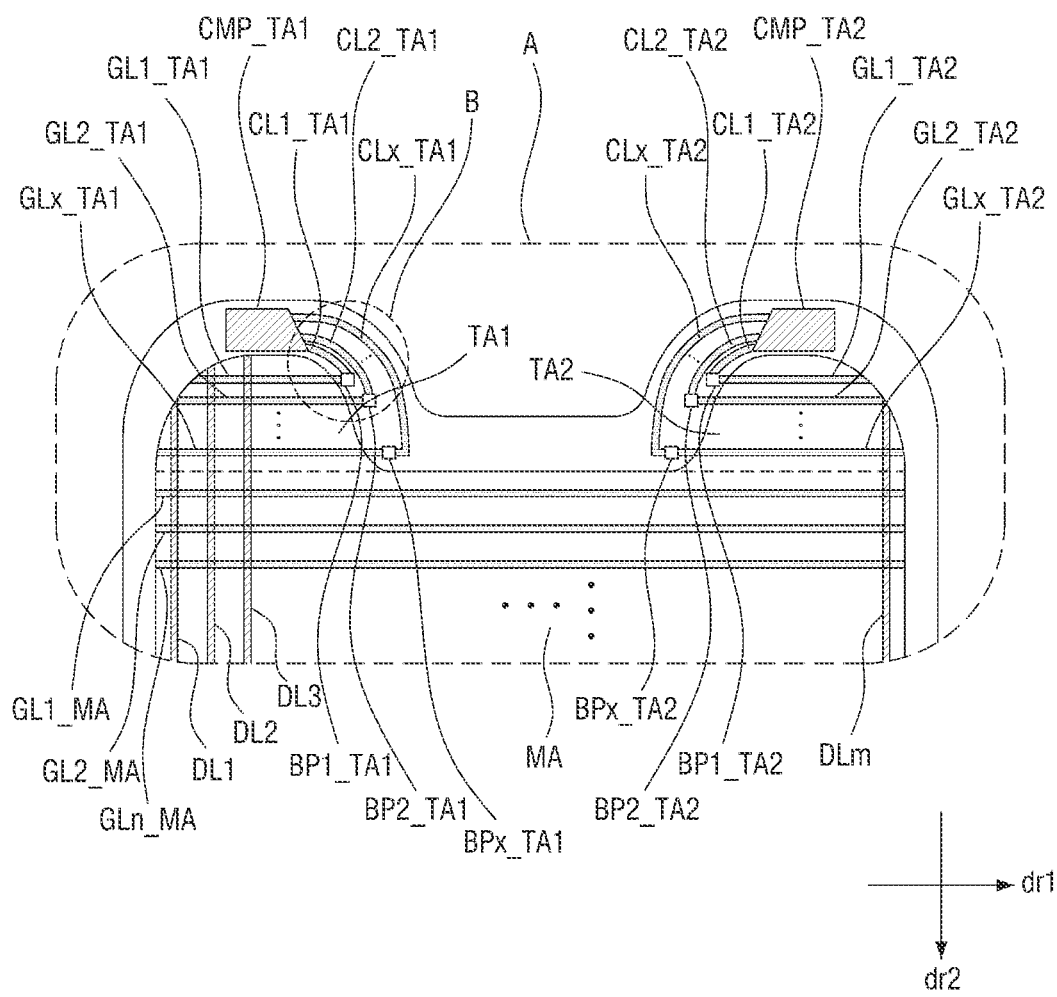
FIG. 4 is an enlarged layout diagram of a region "A" of FIG. 3.

FIG. 4 is an enlarged layout diagram of a region "A" of FIG. 3.

Referring to FIG. 4, the organic light-emitting display device 10 includes the display area DA including the main area MA, the first protruding area TA1, and the second protruding area TA2, and the non-display area BA surrounding the display area DA.

In the display area DA, a plurality of gate lines GL1_MA to GLn_MA, GL1_TA1 to GLx_TA1, and GL1_TA2 to GLx_TA2 extended in a first direction dr1, and a plurality of data lines DL1 to DLm extended in a second direction dr2 may be disposed.

In view of the entire display area DA (i.e. from the viewpoint of FIG. 3), the data lines DL1 to DLm may be arranged in the display area DA without a sharp difference in length. Therefore, the difference in length of the data lines DL1 to DLm may not significantly deteriorate the display quality.

On the other hand, since the gate lines GL1_MA to GLn_MA, GL1_TA1 to GLx_TA1, and GL1_TA2 to GLx_TA2 extend in the first direction dr1, they cannot pass through the first protruding area TA1 and the second protruding area TA2 together. Thus, the lengths of the gate lines GL1_MA to GLn_MA disposed in the main area MA, the lengths of the gate lines GL1_TA1 to GLx_TA1 disposed in the first protruding area TA1, and the lengths of the gate lines GL1_TA2 to GLx_TA2 disposed in the second protruding area TA2 may be greatly different from one another.

Particularly, the two gate lines GL1_MA and GLx_TA1 disposed at the boundary between the main area MA and the first protruding area TA1 may have a relatively large difference in length as compared with other lines. Likewise, the two gate lines GL1_MA and GLx_TA2 disposed at the boundary between the main area MA and the second protruding area TA2 may have a relatively large difference in length as compared with other lines.

In view of the above, according to an exemplary embodiment, the display device may further include compensation lines CL1_TA1 to CLx_TA1 and CL1_TA2 to CLx_TA2 disposed in the non-display area BA that are electrically connected to the gate lines GL1_TA1 to GLx_TA1 disposed in the first protruding area TA1 and the gate lines GL1_TA2 to GLx_TA2 disposed in the second protruding area TA2, respectively.

The gate lines GL1_TA1 to GLx_TA1 disposed in the first protruding area TA1 and the gate lines GL1_TA2 to GLx_TA2 disposed in the second protruding area TA2 are connected to the compensation lines CL1_TA1 to CLx_TA1 and CL1_TA2 to CLx_TA2, respectively, such that their lengths are increased. That is, the gate lines GL1_TA1 to GLx_TA1 disposed in the first protruding area TA1 and the gate lines GL1_TA2 to GLx_TA2 disposed in the second protruding area TA2 are connected to the compensation lines CL1_TA1 to CLx_TA1 and CL1_TA2 to CLx_TA2, respectively, such that they may have resistance values similar to those of the gate lines GL1_MA to GLn_MA disposed in the main area MA. As a result, it is possible to reduce the deterioration of the display quality.

Further, compensation metal patterns CMP_TA1 and CMP_TA2 may be disposed, which are disposed to overlap with a part of each of the compensation lines CL1_TA1 to CLx_TA1 and CL1_TA2 to CLx_TA2 in the non-display area BA and have a plate-like shape covering a certain area. The compensation metal patterns CMP_TA1 and CMP_TA2 may control such that the gate lines GL1_TA1 to GLx_TA1 disposed in the first protruding area TA1 and the gate lines GL1_TA2 to GLx_TA2 disposed in the second protruding area TA2 have capacitance values similar to those of the gate lines GL1_MA to GLn_MA disposed in the main area MA.

In particular, the power supply lines for supplying the first supply voltage ELVDD to each of the pixels PX are disposed closer to the gate lines GL1_MA to GLn_MA, GL1_TA1 to GLx_TA1, and GL1_TA2 to GLx_TA2 than power supply lines for supplying the second supply voltage ELVSS to each of the pixels PX in a cross-section, and thus they may form stronger capacitances. Further, since the power supply lines for supplying the first supply voltage ELVDD to each of the pixels PX provide a constant voltage level or a signal with a relatively small amount of change in voltage continuously, they may form stronger capacitances with the gate lines GL1_MA to GLn_MA, GL1_TA1 to GLx_TA1, and GL1_TA2 to GLx_TA2 than other lines. Accordingly, the compensation metal patterns CMP_TA1 and CMP_TA2 may be formed by using a metal made of the same material as the power supply lines providing the first power voltage ELVDD on the same layer. Further, the first supply voltage ELVDD may be applied to the compensation metal patterns CMP_TA1 and CMP_TA2.

The gate lines GL1_TA1 to GLx_TA1 disposed in the first protruding area TA1 and the gate lines GL1_TA2 to GLx_TA2 disposed in the second protruding area TA2 are electrically connected to the respective compensation lines CL1_TA1 to CLx_TA1 and CL1_TA2 to CLx_TA2, respectively, via a plurality of bridge patterns BP1_TA1 to BPx_TA1 and BP1_TA2 to BPx_TA2.

Each of the bridge patterns BP1_TA1 to BPx_TA1 and BP1_TA2 to BPx_TA2 may be mechanically connected to lines on two sides thereof via at least two metal wiring layers to electrically connect the lines in a cross-section of the organic light emitting display device 10. Due to the structure of the bridge patterns BP1_TA1 to BPx_TA1 and BP1_TA2 to BPx_TA2, it is possible to prevent or substantially prevent unintended high-voltage static electricity, which may occur in the non-display area BA during the process of fabricating the organic light-emitting display device 10, from adversely affecting the drivers of the pixels PX disposed in the display area DA. Thus, it is possible to reduce a deterioration of the display quality of the organic light-emitting display device 10.

Although the structure has been described as a feature for compensating for the resistances and capacitances of the gate lines GL1_MA to GLn_MA, GL1_TA1 to GLx_TA1, and GL1_TA2 to GLx_TA2, it is noted that this is merely illustrative. For example, depending on the direction in which the first protruding area TA1 and the second protruding area TA2 project or the direction in which the data lines DL1 to DLm are extended, the structure may be a feature for compensating for the resistance and capacitance of the data lines DL1 to DLm. Furthermore, the structure may be a feature for compensating for the resistances and capacitances of a variety of lines used for initializing certain nodes of the pixels PX, compensating for threshold voltages of the second transistor T2, sensing the organic light-emitting element EL and compensating for the deterioration by using it, other than the feature for compensating for the gate lines GL1_MA to GLn_MA, GL1_TA1 to GLx_TA1, and GL1_TA2 to GLx_TA2 or the data lines DL1 to DLm.

In addition, although the display area DA is described and shown having the shape including the main area MA and the two protruding areas TA1 and TA2 in the above exemplary embodiment, it is to be understood that a compensation structure for the display area DA having a different shape is also possible. Further, it is to be understood that, in various embodiments, the display area DA may include more or less than two protruding areas, and the display area DA may have a shape other than a rectangle with no protruding area.

The structures of the compensation lines CL1_TA1 to CLx_TA1 and CL1_TA2 to CLx_TA2 and the bridge patterns BP1_TA1 to BPx_TA1 and BP1_TA2 to BPx_TA2 will be described in more detail below.

Figure 5:
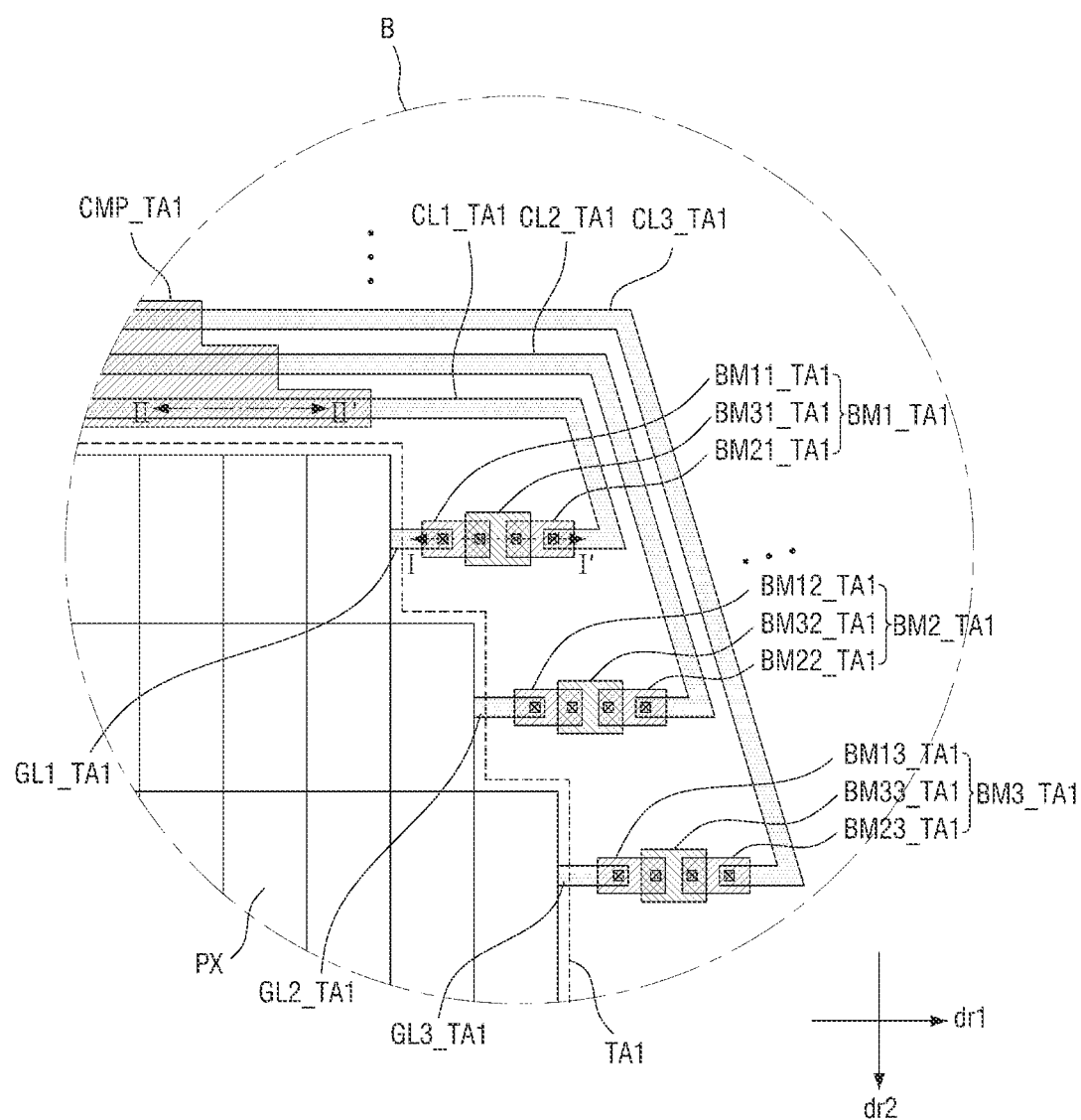
FIG. 5 is an enlarged layout diagram of a region "B" of FIG. 4.
Figure 6:
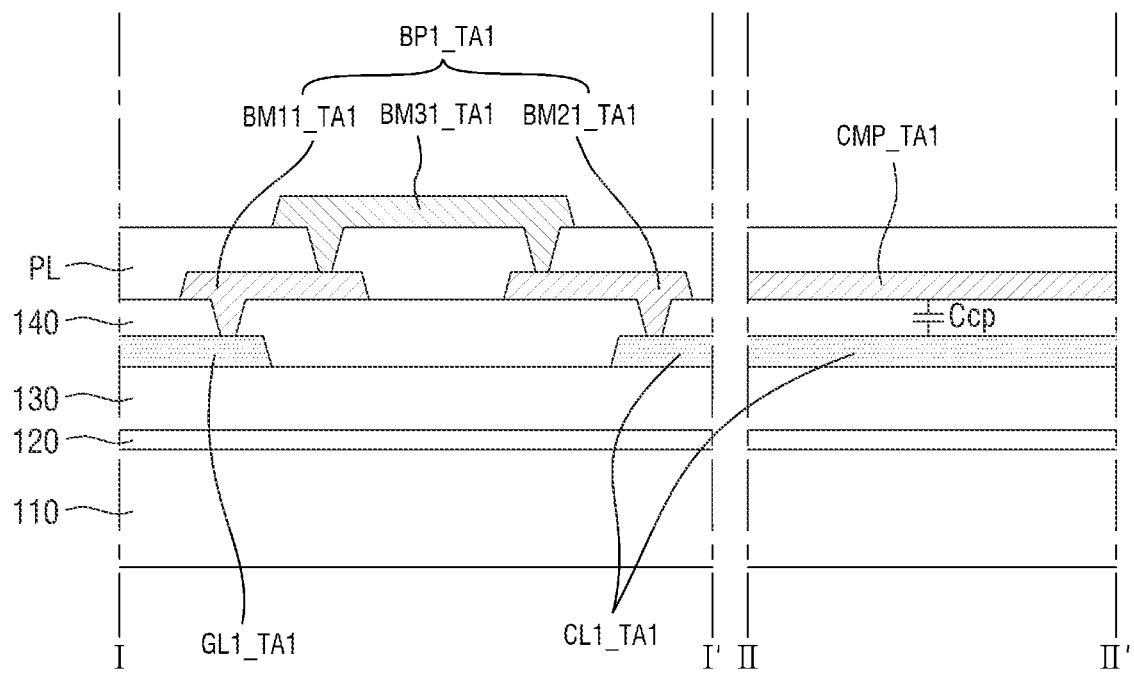
FIG. 6 is a cross-sectional view taken along the lines I-I' and II-II' of FIG. 5.

FIG. 5 is an enlarged layout diagram of a region "B" of FIG. 4. FIG. 6 is a cross-sectional view taken along the lines I-I' and II-II' of FIG. 5.

FIGS. 5 and 6 illustrate in further detail a part of the compensation lines CL1_TA1 to CLx_TA1 and a part of the bridge patterns BP1_TA1 to BPx_TA1 disposed in the first protruding area TA1 of FIG. 4.

Referring to FIGS. 5 and 6, the organic light-emitting display device according to an exemplary embodiment of the present disclosure includes a lower substrate 110, a buffer layer 120, a first insulating layer 130, gate lines GL1_TA1, GL2_TA1, and GL3_TA1, compensation lines CL1_TA1, CL2_TA1, and CL3_TA1, a second insulating layer 140, bridge patterns BP1_TA1, BP2_TA1, and BP3_TA1, and a planarization layer PL.

In an exemplary embodiment, the lower substrate 110 may be an insulating substrate. In an embodiment, the lower substrate 110 may include a glass substrate, a quartz substrate, a ceramic substrate, or a plastic substrate. In another exemplary embodiment, the lower substrate 110 may be a flexible substrate that can be bent, folded, or rolled. Such a lower substrate 110 may include, but is not limited to, polyimide.

The buffer layer 120 may be disposed on the lower substrate 110. The buffer layer 120 can prevent or substantially prevent permeation of impurity elements and can provide a flat surface. In an exemplary embodiment, the buffer layer 120 may include a silicon nitride (SiNx) layer, a silicon oxide ($SiO_2$) layer, or a silicon oxynitride (SiOxNy) layer. In an embodiment, the buffer layer 120 may be omitted depending on a type of the lower substrate 110, process conditions, etc.

Although not shown in the drawings, in an embodiment, a semiconductor layer may be disposed on the buffer layer. The semiconductor layer (not shown) may be an element of switching transistors for driving each of the pixels PX. In an embodiment, the semiconductor layer (not shown) may be made of amorphous silicon, polycrystalline silicon, single crystal silicon, low-temperature polycrystalline silicon and oxide semiconductor, or a mixture thereof.

The first insulating layer 130 is disposed on the buffer layer 120 and the semiconductor layer (not shown). In an exemplary embodiment, the first insulating layer 130 may be a gate insulating layer. The first insulating layer 130 may be made of at least one selected from the group consisting of an inorganic insulating material such as silicon oxide (SiOx) and silicon nitride (SiNx), benzocyclobutene (BCB), an acryl-based material and an organic insulating material such as polyimide, or a mixture thereof.

The gate lines GL1_TA1, GL2_TA1, and GL3_TA1 are disposed on the first insulating layer 130. In addition, the compensation lines CL1_TA1, CL2_TA1, and CL3_TA1 electrically connected to the gate lines GL1_TA1, GL2_TA1, and GL3_TA1 via the bridge patterns BP1_TA1, BP2_TA2, and BP3_TA1, respectively, are disposed.

The gate lines GL1_TA1, GL2_TA1, and GL3_TA1 may be extended in the first direction dr1 from each of pixel rows toward the non-display area BA, and may be connected to the bridge patterns BP1_TA1, BP2_TA2, and BP3_TA1 on one side, respectively.

The compensation lines CL1_TA1, CL2_TA1, and CL3_TA1 may be connected to the bridge patterns BP1_TA1, BP2_TA1, and BP3_TA1 on the opposite side, respectively, to which the gate lines GL1_TA1, GL2_TA1, and GL3_TA1 are not connected. Further, the compensation lines CL1_TA1, CL2_TA1, and CL3_TA1 may be disposed in the non-display area BA such that they surround the first protruding area TA1.

For example, the compensation lines CL1_TA1, CL2_TA1, and CL3_TA1 and the gate lines GL1_TA1, GL2_TA1, and GL3_TA1 may include at least one of an aluminum (AD-based metal including an aluminum alloy, a silver (Ag)-based metal including a silver alloy, a copper (Cu)-based metal including a copper alloy, a molybdenum (Mo)-based metal including molybdenum alloy, chromium (Cr), titanium (Ti), and tantalum (Ta).

The second insulating layer 140 is disposed on the compensation lines CL1_TA1, CL2_TA1, and CL3_TA1 and the gate lines GL1_TA1, GL2_TA1, and GL3_TA1. In an embodiment, the second insulating layer 140 may be made of at least one selected from the group consisting of: an inorganic insulating material such as silicon oxide (SiOx) and silicon nitride (SiNx), benzocyclobutene (BCB), an acryl-based material and an organic insulating material such as polyimide, or a mixture thereof.

First bridge metal patterns BM11_TA1, BM12_TA1, and BM13_TA1 and second bridge metal patterns BM21_TA1, BM22_TA1, and BM23_TA1 are disposed on the second insulating layer 140. In addition, the compensation metal pattern CMP_TA1 is disposed.

The first bridge metal patterns BM11_TA1, BM12_TA1, and BM13_TA1 and the second bridge metal patterns BM21_TA1, BM22_TA1, and BM23_TA1 may be some of the elements of the bridge patterns BP1_TA1, BP2_TA1, and BP3_TA1. The first bridge metal patterns BM11_TA1, BM12_TA1, and BM13_TA1 and the second bridge metal patterns BM21_TA1, BM22_TA1, and BM23_TA1 may form third bridge metal patterns BM31_TA1, BM32_TA1, and BM33_TA1.

The first bridge metal patterns BM11_TA1, BM12_TA1, and BM13_TA1 may be mechanically and electrically connected to the gate lines GL1_TA1, GL2_TA1, and GL3_TA1, respectively, via contact holes penetrating through the second insulating layer 140. In addition, the second bridge metal patterns BM21_TA1, BM22_TA1, and BM23_TA1 may be mechanically and electrically connected to the compensation lines CL1_TA1, CL2_TA1, CL3_TA1, respectively, via contact holes penetrating through the second insulating layer 140.

As such, instead of directly connecting the gate lines GL1_TA1, GL2_TA1, and GL3_TA1 with the compensation lines CL1_TA1, CL2_TA1, and CL3_TA1, by electrically connecting them via the first bridge metal patterns BM11_TA1, BM12_TA1, and BM13_TA1 and the second bridge metal patterns BM21_TA1, BM22_TA1, and BM23_TA1, it is possible to reduce the static electricity that may occur by forming the second insulating layer 140 and the elements on the second insulating layer 140, thereby preventing or substantially preventing deterioration of the display quality. More specifically, it is possible to prevent or substantially prevent static electricity, which may occur in the compensation lines CL1_TA1, CL2_TA1, and CL3_TA1 in the non-display area BA as the second insulating layer 140 and elements on the second insulating layer 140 are formed, from being introduced into each of the pixels PX via the gate lines GL1_TA1, GL2_TA1, and GL3_TA1, thereby reducing deterioration of the display quality. In other words, the bridge patterns BP1_TA1, BP2_TA1, and BP3_TA1 may be a double-bridge structure.

The compensation metal pattern CMP_TA1 may be disposed in a part of the non-display area BA as a plane electrode. The compensation metal pattern CMP_TA1 may be disposed such that it faces the compensation lines CL1_TA1, CL2_TA1, and CL3_TA1 with the second insulating layer 140 therebetween as shown in FIG. 6. As a result, a compensation capacitance Ccp is formed between each of the compensation lines CL1_TA1, CL2_TA1, and CL3_TA1 and the compensation metal pattern CMP_TA1. With this structure, the gate lines GL1_TA1, GL2_TA1, and GL3_TA1 disposed in the first protruding area TA1 may have capacitance values similar to those of the gate lines GL1_MA to GLn_MA disposed in the main area MA.

According to an exemplary embodiment, the width in the first direction dr1 of the first protruding area TA1 becomes smaller toward the top of FIG. 5. Accordingly, in the view point of FIG. 5, the first gate line GL1_TA1 at the top may form the smallest capacitance with adjacent lines. Thus, an area in which the compensation metal pattern CMP_TA1 overlaps with the gate line GL1_TA1 at the top may be the largest. Accordingly, the width in the first direction of the compensation metal pattern CMP_TA1 may differ depending on the positions, as shown in FIG. 4.

As described above, the first supply voltage ELVDD may be applied to the compensation metal pattern CMP_TA1. However, the voltage applied to the compensation metal pattern CMP_TA1 may not be limited thereto.

The first bridge metal patterns BM11_TA1, BM12_TA1, and BM13_TA1, the second bridge metal patterns BM21_TA1, BM22_TA1, and BM23_TA1 and the compensation metal pattern CMP_TA1 may include at least one selected from the group consisting of a metal, an alloy, a metal nitride, a conductive metal oxide, and a transparent conductive material. In an exemplary embodiment, they may have a single-layer structure or a multi-layer structure made of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), tantalum (Ta), etc. In addition, they may be made of an alloy formed by adding at least one element selected from the group consisting of titanium (Ti), zirconium (Zr), tungsten (W), tantalum (Ta), niobium (Nb), platinum (Pt), hafnium (Hf), oxygen (O) and nitrogen (N) to any of the above metals.

The planarization layer PL is disposed on the first bridge metal patterns BM11_TA1, BM12_TA1, and BM13_TA1, the second bridge metal patterns BM21_TA1, BM22_TA1, and BM23_TA1 and the compensation metal pattern CMP_TA1.

The top surface of the planarization layer PL may be substantially flat. Thus, a luminous efficiency of the organic light-emitting element EL described later can be increased. In an exemplary embodiment, the planarization layer PL may include an organic material. For example, the planarization layer PL may include at least one selected from the group consisting of polyimide, polyacryl, and polysiloxane.

The third bridge metal patterns BM31_TA1, BM32_TA1, and BM33_TA1 are disposed on the planarization layer PL. The third bridge metal patterns BM31_TA1, BM32_TA1, and BM33_TA1 may be elements of the bridge patterns BP1_TA1, BP2_TA1, and BP3_TA1, respectively.

The third bridge metal patterns BM31_TA1, BM32_TA1, and BM33_TA1 on one side may be mechanically and electrically connected to the first bridge metal patterns BM11_TA1, BM12_TA1, and BM13_TA1, respectively, via contact holes penetrating through the planarization layer PL. The third bridge metal patterns BM31_TA1, BM32_TA1, and BM33_TA1 on the other side may be mechanically and electrically connected to the second bridge metal patterns BM21_TA1, BM22_TA1, and BM23_TA1, respectively, via contact holes penetrating through the planarization layer PL.

Accordingly, the third bridge metal patterns BM31_TA1, BM32_TA1, and BM33_TA1 can electrically connect the first bridge metal patterns BM11_TA1, BM12_TA1, and BM13_TA1 with the second bridge metal patterns BM21_TA1, BM22_TA1, and BM23_TA1, respectively.

As such, instead of directly connecting the first bridge metal patterns BM11_TA1, BM12_TA1, and BM13_TA1 with the second bridge metal patterns BM21_TA1, BM22_TA1, and BM23_TA1, by electrically connecting them via the third bridge metal patterns BM31_TA1, BM32_TA1, and BM33_TA1, it is possible to reduce the static electricity that may occur by forming the planarization layer PL and the elements on the planarization layer PL, thereby preventing or substantially preventing deterioration of the display quality. More specifically, it is possible to prevent or substantially prevent static electricity, which may occur in the compensation metal pattern CMP_TA1 in the non-display area BA as the planarization layer PL and elements on the planarization layer PL are formed, from being introduced into each of the pixels PX via the compensation lines CL1_TA1, CL2_TA1, and CL3_TA1, the second bridge metal patterns BM21_TA1, BM22_TA1, and BM23_TA1, and the first bridge metal pattern BM11_TA1, BM12_TA1, and BM13_TA1 by the compensation capacitance Ccp, thereby reducing deterioration of the display quality.

In an embodiment, the third bridge metal patterns BM31_TA1, BM32_TA1, and BM33_TA1 may be made of a reflective metal, such as aluminum, silver, chromium, or an alloy thereof. It is, however, to be understood that this is merely illustrative. In an embodiment, the third bridge metal patterns BM31_TA1, BM32_TA1, and BM33_TA1 may be made of the same material as the material of the electrodes of the organic light-emitting element EL.

In this embodiment, some of the gate lines GL1_TA1, GL2_TA1, and GL3_TA1, some of the compensation lines CL1_TA1, CL2_TA1, and CL3_TA1 and some of the bridge patterns BP1_TA1, BP2_TA1, and BP3_TA1 have been described as an example. It is, however, to be understood that exemplary embodiments of the present disclosure are not limited thereto. That is, the above description may be equally applied to other gate lines, other compensation lines, and other bridge patterns disposed in the first protruding area TA1, although not shown in FIGS. 5 and 6. It is to be understood that the description may equally be applied to the second protruding area TA2 as well.

Figure 7:
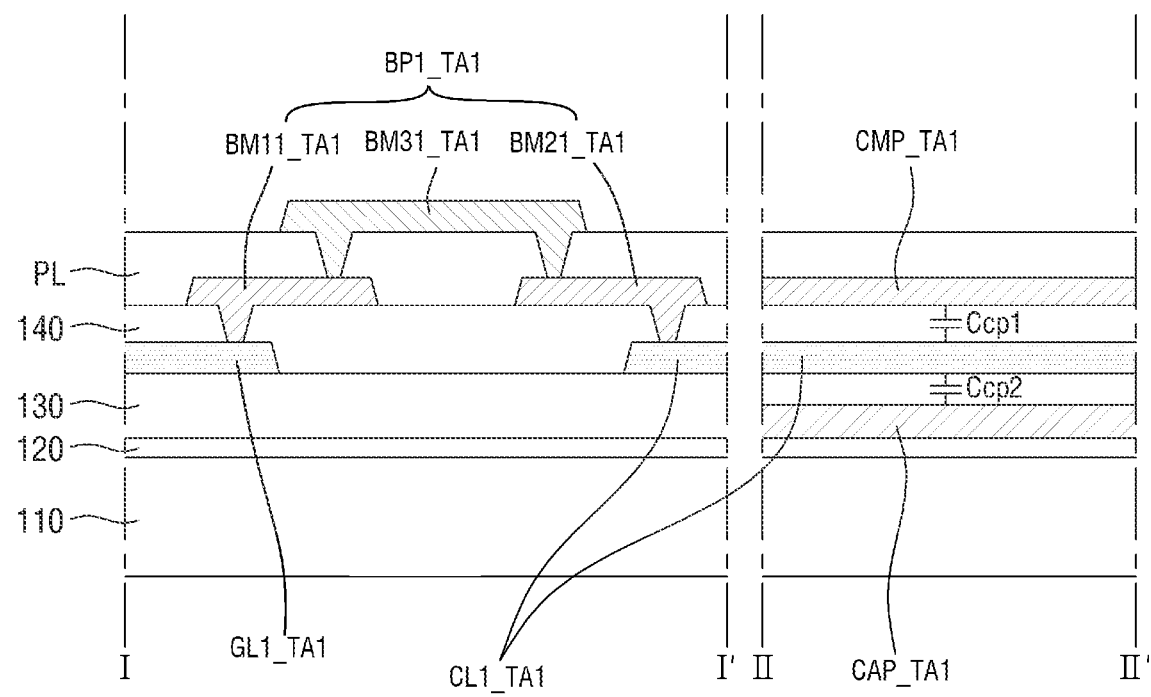
FIG. 7 is a cross-sectional view of an organic light-emitting display device according to another exemplary embodiment of the present disclosure, taken along lines corresponding to the lines I-I' and II-II' of FIG. 5.

FIG. 7 is a cross-sectional view of an organic light-emitting display device according to another exemplary embodiment of the present disclosure, taken along lines corresponding to the lines I-I' and II-II' of FIG. 5.

The elements and reference numerals already described above with respect to FIGS. 1 to 6 will not be described again.

Referring to FIG. 7, the organic light-emitting display device 10 according to another exemplary embodiment of the present disclosure includes a lower substrate 110, a buffer layer 120, a compensation semiconductor pattern CAP_TA1, a first insulating layer 130, gate lines GL1_TA1, GL2_TA1, and GL3_TA1, compensation lines CL1_TA1, CL2_TA1, and CL3_TA1, a second insulating layer 140, bridge patterns BP1_TA1, BP2_TA1, and BP3_TA1, and a planarization layer PL.

That is, the organic light-emitting display device 10 according to this exemplary embodiment further includes the compensation semiconductor pattern CAP_TA1, unlike the organic light-emitting display device 10 shown in FIGS. 1 to 6.

The compensation semiconductor pattern CAP_TA1 is disposed on the buffer layer 120. The compensation semiconductor pattern CAP_TA1 may form a capacitance with the compensation line CL1_TA1. That is, in addition to the compensating metal pattern CMP_TA1 for forming the first compensating capacitance Ccp1 with the compensation line CL1_TA1 to prevent or substantially prevent display quality from deteriorating, the compensation semiconductor pattern CAP_TA1 is additionally disposed to form a second compensation capacitance Ccp2 with the compensation line CL1_TA1. As a result, deterioration of the display quality can be prevented more effectively.

The compensation semiconductor pattern CAP_TA1 may be disposed such that it is overlapped with the compensation metal pattern CMP_TA1. Although not shown in the drawing, the compensation semiconductor pattern CAP_TA1 may have the same shape as the compensation metal pattern CMP_TA1. It is, however, to be understood that this is merely illustrative. In an embodiment, the compensation semiconductor pattern CAP_TA1 may be formed as consecutive pads overlapped with the compensation metal pattern CMP_TA1. In addition, the compensation semiconductor pattern CAP_TA1 may be formed in any of various shapes that can form a capacitance with the compensation line CL1_TA1.

In an embodiment, the compensation semiconductor pattern CAP_TA1 may be formed of the same material as the semiconductor layer (not shown) on the same layer.

Figure 8:
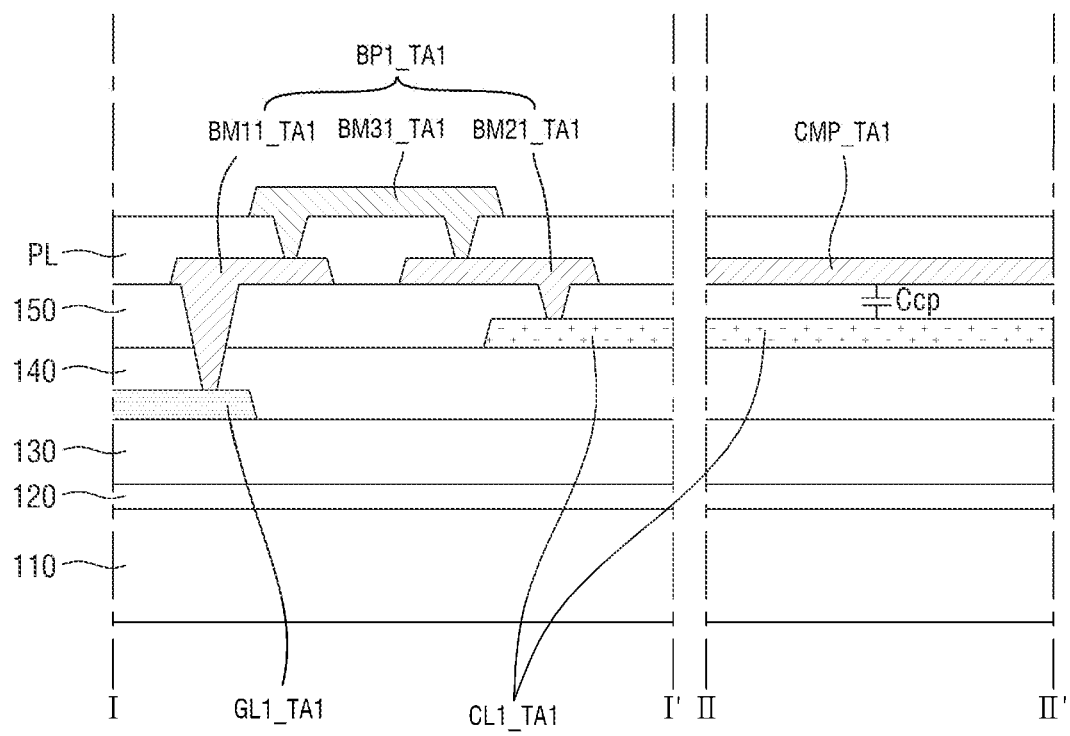
FIG. 8 is a cross-sectional view of an organic light-emitting display device according to another exemplary embodiment of the present disclosure, taken along lines corresponding to the lines I-I' and II-II' of FIG. 5.

FIG. 8 is a cross-sectional view of an organic light-emitting display device according to another exemplary embodiment of the present disclosure, taken along lines corresponding to the lines I-I' and II-II' of FIG. 5.

The elements and reference numerals already described above with respect to FIGS. 1 to 6 will not be described again.

Referring to FIG. 8, the organic light-emitting display device 10 according to another exemplary embodiment of the present disclosure includes a lower substrate 110, a buffer layer 120, a first insulating layer 130, gate lines GL1_TA1, GL2_TA1, and GL3_TA1, a second insulating layer 140, compensation lines CL1_TA1, CL2_TA1, and CL3_TA1, a third insulating layer 150, bridge patterns BP1_TA1, BP2_TA1, and BP3_TA1, and a planarization layer PL.

That is, the organic light-emitting display device 10 according to this exemplary embodiment further includes the third insulating layer 150, unlike the organic light-emitting display device 10 shown in FIGS. 1 to 6. Thus, the locations of the lines may be adjusted. In an embodiment, the third insulating layer 150 may be made of the same material as the first insulating layer 130 and the second insulating layer 140 described above.

The buffer layer 120 is disposed on the lower substrate 110.

The first insulating layer 130 is disposed on the buffer layer 120.

The gate lines GL1_TA1, GL2_TA1, and GL3_TA1 are disposed on the first insulating layer 130.

The second insulating layer 140 is disposed on the gate lines GL1_TA1, GL2_TA1, and GL3_TA1.

The compensation line CL1_TA1 is disposed on the second insulating layer 140.

The third insulating layer 150 is disposed on the compensation line CL1_TA1.

A first bridge metal pattern BM11_TA1, a second bridge metal pattern BM21_TA1 and a compensation metal pattern CMP_TA1 are disposed on the third insulating layer 150.

The first bridge metal pattern BM11_TA1 may be mechanically and electrically connected to the gate line GL1_TA1 through a contact hole penetrating through the second insulating layer 140 and the third insulating layer 150. In addition, the second bridge metal pattern BM21_TA1 may be mechanically and electrically connected to the compensation line CL1_TA1 through a contact hole penetrating through the third insulating layer 150.

The planarization layer PL is disposed on the first bridge metal pattern BM11_TA1, the second bridge metal pattern BM21_TA1, and the compensation metal pattern CMP_TA1.

A third bridge metal pattern BM31_TA1 is disposed on the planarization layer PL.

That is, the organic light-emitting display device 10 according to this exemplary embodiment uses more lines than the organic light-emitting display device shown in FIGS. 1 to 6, thereby preventing or substantially preventing display quality from deteriorating.

Figure 9:
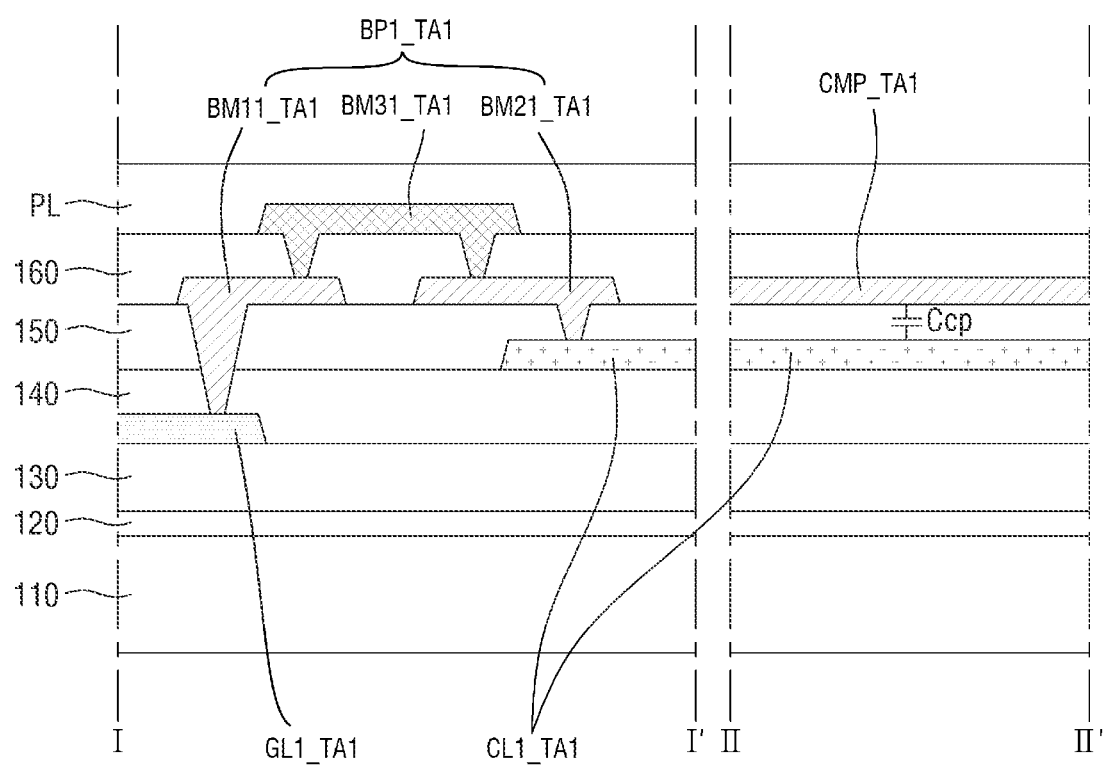
FIG. 9 is a cross-sectional view of an organic light-emitting display device according to another exemplary embodiment of the present disclosure, taken along lines corresponding to the lines I-I' and II-II' of FIG. 5.

FIG. 9 is a cross-sectional view of an organic light-emitting display device according to another exemplary embodiment of the present disclosure, taken along lines corresponding to the lines I-I' and II-II' of FIG. 5.

The elements already described above with respect to FIG. 8 will not be described again.

Referring to FIG. 9, the organic light-emitting display device 10 according to another exemplary embodiment of the present disclosure includes a lower substrate 110, a buffer layer 120, a first insulating layer 130, gate lines GL1_TA1, GL2_TA1, and GL3_TA1, a second insulating layer 140, compensation lines CL1_TA1, CL2_TA1, and CL3_TA1, a third insulating layer 150, a fourth insulating layer 160, bridge patterns BP1_TA1, BP2_TA1, and BP3_TA1, and a planarization layer PL.

That is, the organic light-emitting display device 10 according to this exemplary embodiment further includes the fourth insulating layer 160, unlike the organic light-emitting display device 10 shown in FIG. 8. Unlike the embodiment shown in FIG. 8 in which the third bridge metal pattern BM31_TA1 may be made of the material of the electrode of the organic light-emitting element EL, the third bridge metal pattern BM31_TA1 may be formed by using another metal layer made of the same material as the first bridge metal pattern BM11_TA1 and the second bridge metal pattern BM21_TA1.

The buffer layer 120 is disposed on the lower substrate 110. The first insulating layer 130 is disposed on the buffer layer 120. The gate lines GL1_TA1, GL2_TA1, and GL3_TA1 are disposed on the first insulating layer 130. The second insulating layer 140 is disposed on the gate lines GL1_TA1, GL2_TA1, and GL3_TA1. The compensation line CL1_TA1 is disposed on the second insulating layer 140. The third insulating layer 150 is disposed on the compensation line CL1_TA1. A first bridge metal pattern BM11_TA1, a second bridge metal pattern BM21_TA1, and a compensation metal pattern CMP_TA1 are disposed on the third insulating layer 150.

The fourth insulating layer 160 is disposed on the first bridge metal pattern BM11_TA1, the second bridge metal pattern BM21_TA1, and the compensation metal pattern CMP_TA1. In an embodiment, the fourth insulating layer 160 may be made of at least one selected from the group consisting of: an inorganic insulating material such as silicon oxide (SiOx) and silicon nitride (SiNx), benzocyclobutene (BCB), an acryl-based material and an organic insulating material such as polyimide, or a mixture thereof.

A third bridge metal pattern BM31_TA1 is disposed on the fourth insulating layer 160. The third bridge metal pattern BM31_TA1 may be mechanically and electrically connected to the first bridge metal pattern BM11_TA1 and the second bridge metal pattern BM21_TA1 through contact holes penetrating through the fourth insulating layer 160.

The planarization layer PL is disposed on the fourth insulating layer 160.

That is, the organic light-emitting display device 10 according to this exemplary embodiment may form the third bridge metal pattern BM31_TA1 by using another metal layer made of the same material as the first bridge metal pattern BM11_TA1 and the second bridge metal pattern BM21_TA1.

Figure 10:
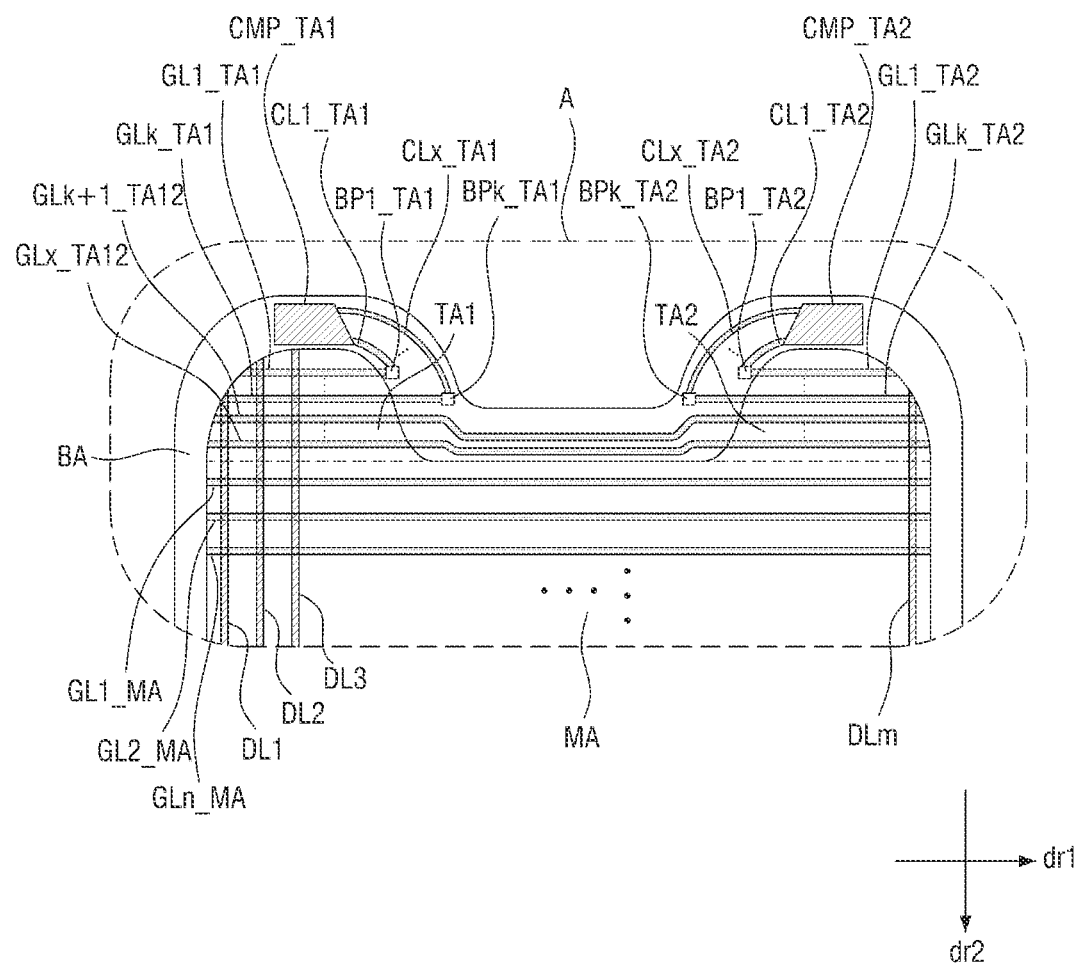
FIG. 10 is an enlarged layout diagram corresponding to the region "A" of FIG. 3 in an organic light-emitting display device according to another exemplary embodiment of the present disclosure.

FIG. 10 is an enlarged layout diagram corresponding to the region "A" of FIG. 3 in an organic light-emitting display device according to another exemplary embodiment of the present disclosure.

The elements and reference numerals already described above with respect to FIGS. 1 to 4 will not be described again.

Referring to FIG. 10, the organic light-emitting display device 10 according to this exemplary embodiment includes the display area DA including the main area MA, the first protruding area TA1 and the second protruding area TA2, and the non-display area BA surrounding it.

In the display area DA, a plurality of gate lines GL1_MA to GLn_MA, GL1_TA1 to GLk_TA1, GL1_TA2 to GLk_TA2, and GL(k+1)_TA12 to GLx_TA12 extending along the first direction dr1 may be disposed in the display region DA, where k is a positive integer greater than one and less than x. According to this exemplary embodiment, the display device may further include compensation lines CL1_TA1 to CLk_TA1 and CL1_TA2 to CLk_TA2 disposed in the non-display area BA, and bridge patterns BP1_TA1 to BPk_TA1 and BP1_TA2 to BPk_TA2.

Unlike the organic light-emitting display device 10 according to the embodiment shown in FIG. 4, the organic light-emitting display device 10 according to this exemplary embodiment may further include the gate lines GL(k+1)_TA12 to GLx_TA12 that are disposed in the first protruding area TA1 and the second protruding area TA2 and also extended through a part of the non-display area BA.

In the organic light-emitting display device 10 according to the exemplary embodiment shown in FIG. 4, none of the gate lines GL1_TA1 to GLx_TA1 and GL1_TA2 to GLx_TA2 disposed in the first protruding area TA1 and the second protruding area TA2 are electrically connected to one another. In contrast, in the organic light-emitting diode display 10 according to the exemplary embodiment of FIG. 10, some of the gate lines GL(k+1)_TA12 to GLx_TA12 disposed in the first and second protruding areas TA1 and TA2 are electrically connected to one another through the non-display area BA. As a result, the difference in lengths between the gate lines GL(k+1)_TA12 to GLx_TA12 and the gate lines GL1_MA to GLn_MA can be reduced.

The gate lines GL(k+1)_TA12 to GLx_TA12 disposed in the non-display area BA may have a bent portion such that they come as close to the main area MA as possible. Accordingly, the spacing between the gate lines GL(k+1)_TA12 to GLx_TA12 measured in the second direction dr2 may be smaller in the non-display area BA than in the first protruding area TA1 and the second protruding area TA2.

Although some exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A light-emitting display device comprising:
a substrate on which a display area and a non-display area are defined, wherein the display area comprises a first area and a second area, and a plurality of pixels is in the display area;
a first signal line on the substrate in the first area;
a second signal line on the substrate in the second area;
a compensation line on the substrate in the non-display area;
a bridge pattern over the second signal line and the compensation line in the non-display area and electrically connecting the second signal line with the compensation line;
a first insulating layer between the bridge pattern and the compensation line, the first insulating layer including a first surface facing the substrate and a second surface opposite to the first surface; and
a compensation metal pattern over the compensation line in the non-display area and overlapping with the compensation line,
wherein the bridge pattern comprises a first bridge metal pattern, a second bridge metal pattern, and a third bridge metal pattern,
wherein the first bridge metal pattern is over the second signal line and electrically connected to the second signal line,
wherein the second bridge metal pattern is over the compensation line and electrically connected to the compensation line,
wherein the third bridge metal pattern is over the first bridge metal pattern and the second bridge metal pattern and electrically connects the first bridge metal pattern with the second bridge metal pattern, and
wherein the first bridge metal pattern, the second bridge metal pattern, and the compensation metal pattern directly contact the second surface of the first insulating layer.

2. The light-emitting display device of claim 1, further comprising:
a second insulating layer disposed on the first bridge metal pattern and the second bridge metal pattern,
wherein the third bridge metal pattern is disposed on the second insulating layer, and
wherein the second insulating layer is disposed between the third bridge metal pattern and the first bridge metal pattern.

3. The light-emitting display device of claim 1, further comprising:
a third insulating layer disposed on the first signal line and the second signal line,
wherein the compensation line is disposed on the third insulating layer, and
wherein the third insulating layer is disposed between the compensation line and the first signal line.

4. The light-emitting display device of claim 1, wherein each of the pixels comprises a light-emitting element,
wherein the third bridge metal pattern is made of a same material as an electrode of the light-emitting element.

5. The light-emitting display device of claim 1, wherein each of the pixels comprises a light-emitting element,
wherein the light-emitting display device further comprises a planarization layer disposed between the light-emitting element and the third bridge metal pattern.

6. The light-emitting display device of claim 1, further comprising a compensation semiconductor pattern disposed between the substrate and the compensation line in the non-display area and overlapping with the compensation line.

7. The light-emitting display device of claim 1, wherein each of the pixels comprises a light-emitting element,
wherein a voltage applied to the compensation metal pattern is equal to a supply voltage applied to the light-emitting element.

8. The light-emitting display device of claim 1, wherein signals which the first signal line and the second signal line are configured to provide are gate signals.

9. The light-emitting display device of claim 1, wherein the second area is extended from the first area.

10. A light-emitting display device comprising:
a substrate on which a display area and a non-display area are defined, wherein the display area comprises a first area and a second area, and a plurality of pixels is in the display area;
a first signal line on the substrate in the first area;
a second signal line on the substrate in the second area;
a compensation line on the substrate in the non-display area;
a first insulating layer over the first signal line, the second signal line, and the compensation line, the first insulating layer including a first surface facing the substrate and a second surface opposite to the first surface;
a first bridge metal pattern directly on the second surface of the first insulating layer in the non-display area and electrically connected to the second signal line;
a second bridge metal pattern directly on the second surface of the first insulating layer in the non-display area and electrically connected to the compensation line;
a compensation metal pattern directly on the second surface of the first insulating layer in the non-display area and overlapping with the compensation line;
a second insulating layer on the first bridge metal pattern and the second bridge metal pattern; and
a third bridge metal pattern on the second insulating layer in the non-display area and electrically connected to the first bridge metal pattern and the second bridge metal pattern.

11. The light-emitting display device of claim 10, wherein the compensation line is arranged on a different layer from a layer on which the first signal line and the second signal line are arranged.

12. The light-emitting display device of claim 10, wherein the compensation metal pattern overlaps with the compensation line in the non-display area.

13. The light-emitting display device of claim 12, further comprising a compensation semiconductor pattern on a layer between the substrate and the compensation line in the non-display area and overlapping with the compensation line.

14. The light-emitting display device of claim 12, wherein each of the pixels comprises a light-emitting element,
wherein a voltage applied to the compensation metal pattern is equal to a supply voltage applied to the light-emitting element.

15. The light-emitting display device of claim 10, wherein signals which the first signal line and the second signal line are configured to provide are gate signals.

16. The light-emitting display device of claim 10, wherein the second area is extended from the first area.

17. A light-emitting display device comprising:
a substrate on which a display area and a non-display area are defined, wherein the display area comprises a first area and a second area, and a plurality of pixels is in the display area;
a first signal line on a surface of the substrate in the first area;
a second signal line on the surface of the substrate in the second area;
a compensation line on the substrate in the non-display area; and
a bridge pattern over the second signal line and the compensation line in the non-display area and electrically connecting the second signal line with the compensation line,
wherein the first signal line and the second signal line are configured to provide signals to the plurality of pixels,
wherein the bridge pattern comprises a first bridge metal pattern, a second bridge metal pattern, and a third bridge metal pattern,
wherein the first bridge metal pattern is over the second signal line and electrically connected to the second signal line,
wherein the second bridge metal pattern is over the compensation line and electrically connected to the compensation line,
wherein the third bridge metal pattern is over the first bridge metal pattern and the second bridge metal pattern and electrically connects the first bridge metal pattern with the second bridge metal pattern,
wherein the third bridge metal pattern overlaps the first bridge metal pattern and the second bridge metal pattern in a direction perpendicular to the surface of the substrate, and
wherein, along a direction of the surface of the substrate, the third bridge metal pattern contacts the first bridge metal pattern and the second bridge metal pattern at respective locations that are between a location at which the first bridge metal pattern contacts the second signal line and a location at which the second bridge metal pattern contacts the compensation line, and the light-emitting display device further comprises a compensation metal pattern overlapping with the compensation line, the compensation metal pattern being at a same level as the first bridge metal pattern and the second bridge metal pattern.

* * * * *